United States Patent
Feuerbaum et al.

(10) Patent No.: US 7,638,777 B2
(45) Date of Patent: Dec. 29, 2009

(54) IMAGING SYSTEM WITH MULTI SOURCE ARRAY

(75) Inventors: Hans-Peter Feuerbaum, Munich (DE); Jürgen Frosien, Riemerling (DE); Uli Hoffmann, Riemerling (DE); Dieter Winkler, Munich (DE); Pavel Adamec, Haar (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 482 days.

(21) Appl. No.: 10/564,752

(22) PCT Filed: May 17, 2004

(86) PCT No.: PCT/EP2004/005288

§ 371 (c)(1), (2), (4) Date: May 31, 2006

(87) PCT Pub. No.: WO2005/006385

PCT Pub. Date: Jan. 20, 2005

(65) Prior Publication Data

US 2006/0237659 A1    Oct. 26, 2006

(30) Foreign Application Priority Data

Jul. 14, 2003    (EP)    ................... 03016005

(51) Int. Cl.
*H01J 1/50*    (2006.01)

(52) U.S. Cl. ................... 250/396 R; 250/310

(58) Field of Classification Search ............ 250/492.22, 250/398, 396 R, 310; 324/750, 751
See application file for complete search history.

(56) References Cited

U.S. PATENT DOCUMENTS

| 4,695,732 | A | 9/1987 | Ward |
| 4,939,373 | A | 7/1990 | Elliston et al. |
| 6,023,060 | A | 2/2000 | Chang et al. |
| 6,369,385 | B1 | 4/2002 | Muray et al. |
| 6,476,390 | B1 | 11/2002 | Murakoshi et al. |
| 6,617,587 | B2 * | 9/2003 | Parker et al. ............ 250/398 |
| 6,774,646 | B1 * | 8/2004 | Han et al. ............... 324/751 |
| 7,049,585 | B2 * | 5/2006 | Nakasuji et al. ......... 250/310 |

FOREIGN PATENT DOCUMENTS

EP    1 261 016 A    11/2002

\* cited by examiner

*Primary Examiner*—Kiet T Nguyen
(74) *Attorney, Agent, or Firm*—Patterson & Sheridan, LLP (57) ABSTRACT

The present invention provides a charged particle beam device. The device comprises an emitter array for emitting a plurality of charged particle beams. The plurality of charged particle beams are imaged with a lens. An electrode unit is provided for accelerating the plurality of charged particle beams. The potential differences between a first potential of the emitter array, a second potential of the electrode unit, and a third potential of a specimen, are controlled by a first control unit and a second control unit. Thereby, the second potential is capable of accelerating the plurality of charged particle beams with respect to the first potential, and the third potential is capable of decelerating the plurality of charged particle beams with respect to the second potential.

22 Claims, 8 Drawing Sheets

IMAGING SYSTEM WITH MULTI SOURCE ARRAY

CROSS-REFERENCE TO RELATED APPLICATIONS

This application claims foreign priority benefits under 35 U.S.C. §119 to co-pending European patent application number EP03016005.5, filed Jul. 14, 2003. This related patent application is herein incorporated by reference in its entirety.

FIELD OF THE INVENTION

The invention relates to a charged particle beam device for inspection system applications, testing system applications, lithography system applications and the like. It also relates to methods of operation thereof. Further, the present invention relates to a charged particle beam device with a plurality of charged particle beams. Specifically, the present invention relates to a charged particle beam device and to a method of imaging a plurality of charged particle beams.

BACKGROUND OF THE INVENTION

Charged particle beam apparatuses are used in a plurality of industrial fields. Inspection of semiconductor devices during manufacturing, exposure systems for lithography, detecting devices and testing systems are only some of these fields.

In general, there is a high demand for structuring and inspecting specimens within the micrometer or nanometer scale. On such a small scale, process control, inspection or structuring is often done with charged particle beams, e.g. electron beams, which are generated and focused in charged particle beam devices such as electron microscopes or electron beam pattern generators. Charged particle beams offer superior spatial resolution compared to, e.g. photon beams due to their short wavelengths.

Thereby, throughput of devices for maskless lithography, inspection or defect review is a demanding task. To increase the throughput, multiple beam devices can be used. In order to integrate more charged particle beams, axis-free systems are proposed, whereby several charged particle beams are imaged within one charged particle optic. Such axis-free or distributed axis optical systems require specific conditions to be able to provide sufficient imaging quality. As these conditions limit other constructional and technical aspects, axis-free charged particle optical systems have to be further improved.

SUMMARY OF THE INVENTION

The present invention intends to provide an improved charged particle system for a plurality of charged particle beams. Thereby, the imaging quality of axis-free or distributed axis systems has to be improved such that constructional conditions can be fulfilled without deteriorating the resolution of the system. According to aspects of the present invention, a charged particle beam device according to independent claim 1 and a method of imaging a plurality of charged particle beams according to independent claim 20 are provided.

According to one aspect of the present invention, a charged particle beam device is provided. The charged particle beam device comprises an emitter array for emitting a plurality of charged particle beams and a lens for imaging the plurality of charged particle beams. At least one acceleration unit is provided for accelerating the plurality of charged particle beams.

For controlling the potential differences between a first potential of the emitter array, a second potential of the electrode unit, and a third potential of a specimen, a first control unit and a second control unit are provided. Thereby, the second potential is capable of accelerating the plurality of charged particle beams with respect to the first potential and the third potential is capable of decelerating the plurality of charged particle beams with respect to the second potential.

According to a further aspect, the acceleration unit is provided as an electrode unit. Thereby, the charged particle beams are accelerated towards the electrode unit and pass through apertures in the electrode unit.

According to an even further aspect, the electrode unit can be provided as a mesh or as a plate with apertures fabricated therein.

The aspects according to the present invention enable an increased working distance without critical deterioration of the imaging quality and, thus, the resolution of the system. Thus, an improved differential pumping can be realized. That leads to the fact that emitter tips, which might require UHV conditions for stable operation can more easily be operated. Further, the increased working distance disburdens the scanning of the charged particle beams over the specimen, since the same scanning region can be scanned with smaller deflection angles.

The increased working distance, that is, the distance between the emitter array and the specimen, is according to a further aspect at least 10 mm, preferably at least 50 mm, more preferably at least 100 mm.

According to a further aspect, a charged particle beam device is provided whereby the potential of the specimen is capable of defining the charged particle beam energy on impingement of the plurality of charged particle beams on the specimen such that it corresponds to a potential of maximal 5 kV and whereby the potential of the electrode unit is capable of increasing the charged particle beam energy to an energy that is at least a factor 5 higher than the energy corresponding to the potential of the specimen.

According to further aspect, the above potentials are capable of defining an impingement energy corresponding to a potential of less than 1 kV.

According to an even further aspect according to the present invention, the energy of the charged particle beams at the proximity of the electrode unit is at least a factor of 10 higher than the energy of the charged particle beams on impingement on the specimen.

Thus, it is possible to image, pattern or a specimen with low energy charged particles. Thereby, damage to the specimen or charging of the specimen can be avoided. However, the increase of the charged particle energy between the emitter array and the specimen results in an improvement of the resolution which allows to increase the working distance whereby an acceptable resolution can be maintained.

According to a further aspect according to the present invention, the charged particle beam device further comprises an extraction member for extracting the plurality of charged particle beams and a beam focusing member, which controls the emitting angle of the plurality of charged particle beams. Therefore, the emitting current and the emitting angle can be controlled. Thus, the imaging quality can further be adjusted.

According to an even further aspect of the present invention, the device comprises a further electrode unit. Thereby, the further electrode unit satisfies the same conditions regarding the biasing to an acceleration potential as the (first) electrode unit.

According to a further aspect of the present invention, a magnetic lens is provided, whereby the plurality of charged particle beams are focused with a homogeneous magnetic lens field generated.

According to an even further aspect, the lens for imaging the plurality of charged particle beams comprises a unit for providing a homogenous magnetic field with at least one coil, and alternatively, an additional pole piece.

According to an even further aspect of the present invention, a deflection system for deflecting the plurality of charged particle beams is provided. According to an even further aspect, the deflection system is provided by a magnetic and/or a electrostatic deflection system.

Making use of the above aspects, the charged particle beams can either be individually deflected, they can be deflected conjointly, or groups of conjointly deflected charged particle beams can be deflected independently from other groups of conjointly deflected charged particle beams.

In view of the previous aspects, the electron beam can be imaged to obtain a well focused raster-scanned image of the specimen or to pattern the specimen accordingly.

According to a further aspect, the at least one electrode unit for accelerating the charged particle beams is formed such that two regions of the charged particle device are at least partly vacuum isolated. Thereby, a transparency ratio smaller than 1:500 is realized.

According to a further aspect of the present invention, a method of imaging a plurality of charged particle beams is provided. The method comprises the following steps. The plurality of charged particle beams are emitted with an emitter array system. A lens is provided to generate, on excitation, a magnetic lens field to focus the plurality of charged particle beams on a specimen. At least two control units are provided. These are operated to define a first potential of the emitter array, a second potential of an electrode unit and a third potential of a specimen with respect to each other or with respect to an external potential (e.g. ground).

According to an even further aspect, the potential of the specimen is provided such that the plurality of charged particle beams impinge on the specimen with an energy corresponding to maximal 2 kV.

The term "providing a potential" is to be understood as applying a potential to the respective component. Thus, if e.g. one component is connected to earth, ground potential is provided. In view thereof, providing three different potentials to three different components require two control units for defining two of the three components, each with respect to any of the other potentials. One of the potentials can be provided by connecting the respective component to any fixed (external) potential.

According to an even further aspect, the following steps are conducted, namely: providing a first vacuum in a first region between the emitter array and the electrode unit and providing a second vacuum in a second region between the electrode unit and the specimen. Thereby, the pressure in the first vacuum is at least a factor 10 lower than the pressure in the second vacuum.

The invention is also directed to apparatus for carrying out the disclosed methods, including apparatus parts for performing each of the described method steps. These method steps may be performed by way of hardware components, a computer programmed by appropriate software, by any combination of the two, or in any other manner. Furthermore, the invention is also directed to methods by which the described apparatus operates or is manufactured. It includes method steps for carrying out every function of the apparatus.

BRIEF DESCRIPTION OF THE DRAWINGS

Some of the above indicated and other more detailed aspects of the invention, will be described in the following description and partially illustrated with reference to the figures. Therein.

DETAILED DESCRIPTION OF THE DRAWINGS

Without limiting the scope of protection of the present application, in the following the charged particle beam device will exemplarily be referred to as an electron beam device. Thereby, the electron beam device might especially be an electron beam inspection or lithography system. The present invention can still be applied for apparatuses using other sources of charged particles and/or other secondary and/or backscattered charged particles to obtain a specimen image.

Those skilled in the art would also appreciate that all discussions herein related to voltages and potentials refer to relative and not absolute terms. For example, accelerating the beam by connecting an emitter to "ground" and applying 3 kV to the sample is equivalent to applying negative 3 kV to the emitter and placing the specimen on ground. Therefore, while for convenience some discussion is provided in terms of specific voltages, it should be understood that the reference is to relative potential.

Within the following description of the drawings the same reference numbers refer to the same components. Generally, only the differences with respect to the individual embodiments are described.

Figure 1A:
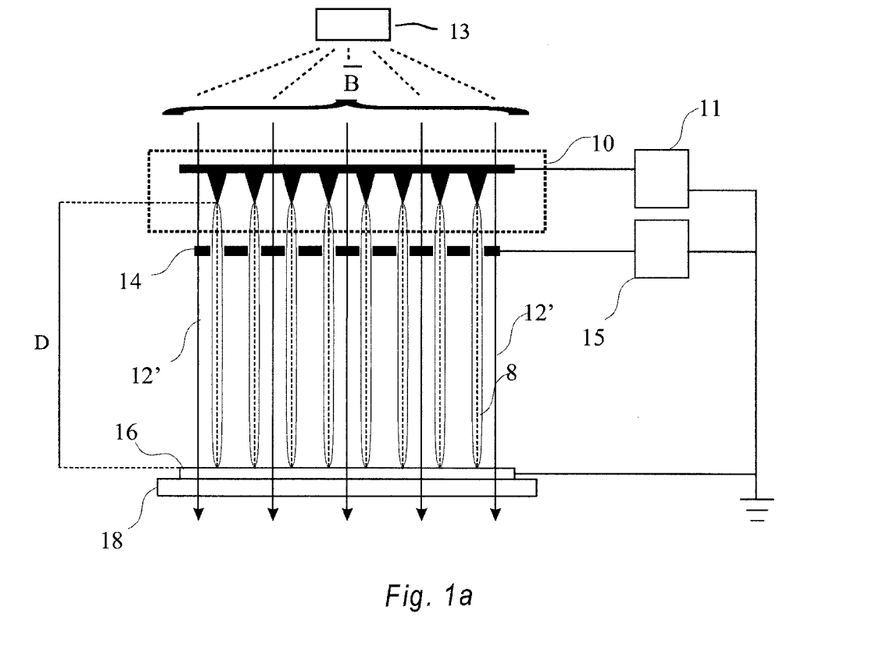
FIG. 1a shows a schematic side view of a first embodiment according to the present invention.

FIG. 1a shows a first embodiment according to the present invention. As an example and not limiting to the present invention it is referred to inspection of a specimen. An emitter array system 10 emits a plurality of electron beams 8, to inspect integrated circuits on a specimen 16. The specimen is located on specimen stage 18, which is capable of moving the specimen with respect to the electron beams 8. A lens 13 generates a magnetic lens field 12' (B) to focus the electron beams on the specimen.

The electron beams emitted by the emitter tips of emitter array system 10 are accelerated towards electrode unit 14. Thus, an increased electron beam energy at the electrode unit is realized as compared to the beam energy of the emitted electron beams. After passing through the electrode unit, the electron beams are decelerated to impinge on specimen 16 at an energy of e.g. 2 kV or lower. The respective potentials of the emitter array, the electrode unit and the specimen with respect to each other are controlled by control units 11 and 15, respectively. FIG. 1 shows an example wherein the specimen is on ground potential whereas the electrode unit and the emitter array is biased with respect to the specimen potential (ground).

It is also possible to use three control units 11, 15 and 17 (see FIGS. 2a to 6). Thereby, the potentials of the specimen, the electrode unit and the emitter array are defined with respect to an external potential (e.g. ground). Generally, the three potentials have to be defined with respect to each other. Therefore, at least two control units have to define one potential with respect to another potential. All possible permutations of defining the three potentials with respect to each other or with respect to a further (external) potential, are well within the scope of protection. Thereby, the variations shown for individual embodiments in the figures can be used with any of the other embodiments. Further, independent of the specific embodiments shown in the present application, control units 11, 15 and 17 can at least partly be located within one housing, or the different potentials can be generated or obtained by the same power supply unit.

A system as shown e.g. in FIG. 1a, does not suffer from the small imaging field size of a single electron beam optical system and the limited throughput associated therewith. Further, such a system does not suffer from the small working distance, which has been required in the past for distributed axis imaging systems. Distributed axis systems image more than one electron beam and can be considered axis-free with respect to the individual beams. These systems generally require short working distances in order to obtain a sufficient resolution.

Contrary thereto, the embodiment according to the present invention can have a larger working distance D. Thus, a differential pumping, which is required for an UHV in the emitter region, can be realized. The term "differential pumping" refers to the fact that different vacuum levels are realized within different regions of the system. Thereby, on the one hand, the region wherein the emitter tips are located can be kept at a UHV pressure and, on the other hand, the region wherein the specimen is located can be kept at a vacuum level which is sufficient to avoid ionization of residual gas. Thus, it is not required to keep a UHV vacuum level within the entire system, which is difficult due to outgassing of the specimen.

The modifications of a distributed axis imaging system will be explained in more details below. Generally, the entire system has to be operated under vacuum conditions. First, a vacuum level with a pressure of maximal $10^{-6}$ mbar has to be realized. Second, the emitter tips, e.g. field emitters, within the emitter array system 10 require an even lower pressure for steady operation and reliability (e.g. ca. $10^{-8}$ mbar)

In the case where an insufficient vacuum is realized, outgassing of the specimen inserted in the vacuum of the inspection system can be harmful to the measurement conditions. In the event that if the vacuum in the area wherein the emitter tips are located is insufficient this is especially true, since the emitter tips require lower pressure vacuum conditions.

Thus, as a first approach, it could be considered beneficial for differential pumping to increase the working distance D between the emitter array system 10 and the specimen 16. However, as will be explained below, increasing the working distance deteriorates the imaging quality of the lens and thus the resolution of the system. The beam diameter in the plane of the specimen is given by $$d_{tot} = \sqrt{d_c^2 + d_s^2 + d_e^2} \quad \text{(No. 1)}$$

Therein, $d_c$ is the chromatic aberration disc, $d_s$ is the spherical aberration disc and $d_e$ is the emitter aberration disc. Since $d_c$ and $d_s$ are both proportional to the working distance D, increasing the working distance is disadvantageous with respect to the resolution of the system.

Since an improved resolution of an inspection system is generally a further task to be considered, increasing the working distance is contradictory to the general teaching.

In the case where the increased working distance is nevertheless used, it might be considered increasing the electron beam energy, since the chromatic aberration disc follows the proportionality of equation No. 2:

$$d_c \approx D \cdot \alpha_w \cdot \frac{\Delta U_g}{U_e}. \quad \text{(No. 2)}$$

Therein $C_c$ is the chromatic aberration coefficient, $\alpha_w$ the aberration angle in the wafer plane, $\Delta U_g$ the half of the energy width of the electron beam and $U_e$ the beam energy.

From equation No. 2 it can be deduced that increasing the beam energy $U_e$ decreases the chromatic aberration disc. However, on the one hand, high energy electrons can destroy structures on the specimen to be inspected and can lead to charging of the specimen. On the other hand, the spherical aberration disc $$d_s \approx D \cdot \alpha_w^3 \quad \text{(No. 3)}$$

is independent of the electron beam energy $U_e$. Consequently, a further improvement is necessary.

In view of the above, in a further step, it is necessary to introduce an acceleration and deceleration. Thereby, based on corresponding equations, the chromatic aberration disc can be calculated as follows:

$$d_c = 2 \cdot D \cdot \Delta U_g \cdot \sin(\alpha_w) \frac{1}{U_a \cdot (1 + \sqrt{U_w/U_a})} \quad \text{(No. 4)}$$

with $$\alpha_w = \alpha_0 \sqrt{U_e/U_w} \quad \text{(No. 5)}$$

Therein, D is the working distance, $U_e$ the emitter voltage, $U_w$ the beam voltage on the wafer, $U_a$ the acceleration voltage, $\alpha_0$ the emission angle of the emitter, $\alpha_w$ the angle in the wafer plane and $\Delta U_g$ the half of the energy width. Further, in the above mentioned case, the spherical aberration disc calculates as follows:

$$d_s = 2 \cdot D \cdot \frac{U_w}{U_a} \alpha_w^3 \quad \text{(No. 6)}$$

Thus, increasing the beam energy from e.g. 10 V (e.g. $\alpha_0$=5°) to 10 kV and decreasing the beam energy towards e.g. 1 kV on the wafer, which is located at e.g. a working distance of 100 mm, yields to the following results. The chromatic aberration disc $d_c$ is approximately 33 nm, the spherical aberration disc $d_s$ is approximately 13 nm, and the total beam diameter $d_{tot}$ results in approximately 61 nm.

As a result, an embodiment according to the present invention allows the increase of the working distance D and therefore allows improved differential pumping. At the same time sufficient resolution can be obtained.

Figure 1B:
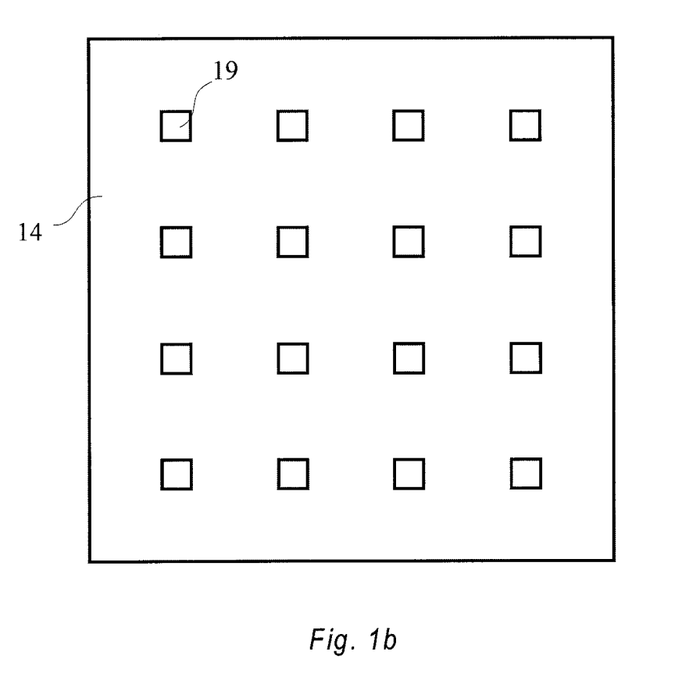
FIG. 1b shows a schematic view of the electrode unit for accelerating the charged particle beams.

FIG. 1b shows a more detailed view of the electrode unit 14. Within the electrode unit 14 there are apertures 19 for trespassing of the electron beams. The plate is biased to the desired potential. Thus, the plate acts as an electrode. In the case where the plate is biased to a more positive potential than the electron beam energy, the electrons are accelerated towards the electrode unit 14 and trespass the apertures 19.

Electrode unit 14 as shown in FIG. 1b can e.g. be formed of a thin silicon substrate. Apertures 19 are etched in the substrate. Thereby, accurate distances and shapes can be realized. Further details will be described with respect to FIG. 5c.

Figure 2A:
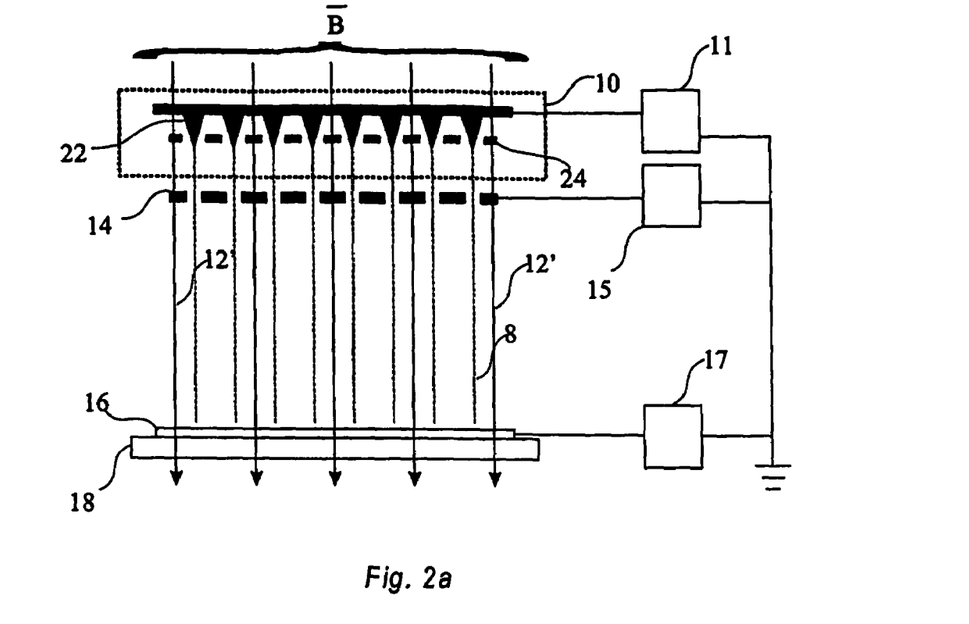
FIGS. 2a to 2b show schematic side views of different embodiments with different emitter array systems.
Figure 2B:
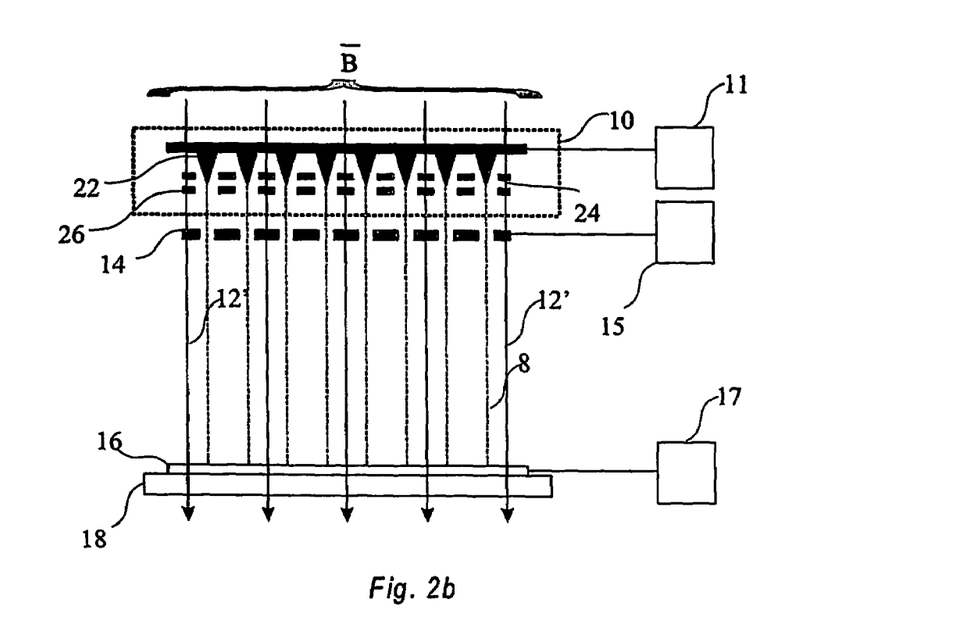

Other embodiments according to the present invention are shown in FIGS. 2a and 2b. Thereby, it is merely referred to the differences with respect to FIG. 1a. Within FIG. 2a, the electron emitter system 10 comprises an emitter array 22 and an extraction member 24. The emitter array 22 includes the emitter tips for emitting the electron beams. The extraction member is on a slightly more positive potential than the emitter tips. Thereby, electrons are extracted from the emitter tip. As an example, the emitter tip can be biased to −1 kV, whereas the extraction member is biased to −900 V. As a result, the electron beams would impinge on a specimen on ground potential at an energy of 1 kV.

From equations No. 4 to 6 above it can be deduced that the total beam diameter in the plane of the wafer also depends on the emission angle of the emitter $\alpha_0$. The larger the emission angle is, the larger the total beam diameter in the plane of the wafer becomes. In the case where e.g. field emitter tips are used to emit electrons, the emission angle of the emitter generally is too large to realize a sufficiently small beam diameter in the plane of the wafer. Thus, the resolution of the inspection system should be improved. One possibility is to reduce the emission angle of the emitter $\alpha_0$.

Therefore, within FIG. 2b an emitting angle defining member 26 is located below the extractor 24. The emitting angle defining member is on a slightly more negative potential than the extraction member. Thus, the widely spread electron emission from the emitter tips is focused such that the emission angle $\alpha_0$ gets smaller. As an example, the emitter tips of emitter array 22 can be biased to −1 kV, the extraction member can be biased to −900 V, whereas the emitting angle defining member 26 can be biased to −1 kV. Thereby, the emission angle $\alpha_0$ is reduced.

The emitter array, the extraction member and the emitting angle defining member can, as an alternative, be controlled independently for each electron beam or independently for a group of electron beams. Therefore, individually controllable electrodes form the extraction member, or the emitting angle defining member, respectively. Differences in the focal length or the like between individual electron beams can be compensated by applying different potentials to e.g. each individual electrode of the emitting angle defining member.

As already explained with respect to FIG. 1a, within FIGS. 2a and 2b, the electron beams are accelerated from the emitter array system towards the electrode unit 14. To continue the example referred to with respect to FIG. 2b, the emitter array potential is e.g. −1 kV. If the electrode unit is biased to 20 kV, the electron beam energy is increased by 21 kV between the emitter array and the electrode unit 14. If the specimen is on ground potential, the electron beam energy is decreased by 20 kV between the electrode unit 14 and the specimen 16. Thus, the energy of the electron beams at the electrode unit is a factor 20 higher than the energy of the electron beams on impingement of the specimen.

As explained above, according to the present invention, it is possible to increase the working distance D between the emitter array system 10 and the specimen 16. This is beneficial for two reasons. First, differential pumping can be improved. Second, electron beam deflection for scanning the electron beams gets less difficult, since for larger working distances the deflection angles can be reduced even though the same area is scanned.

Figure 3A:
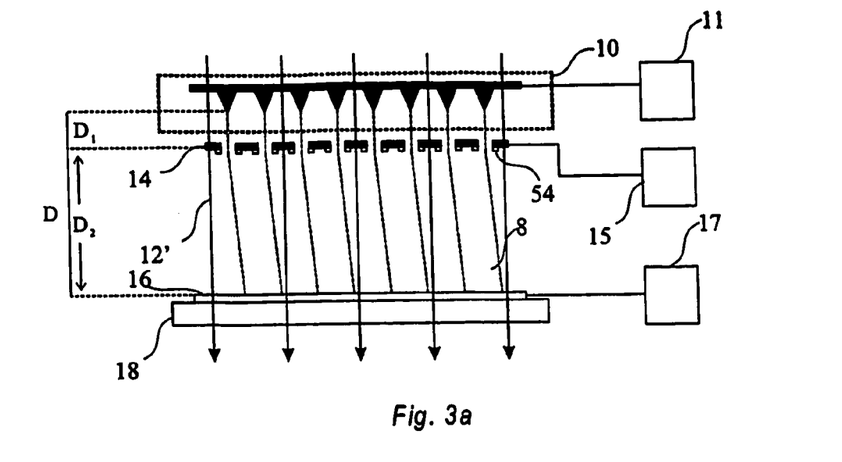
FIGS. 3a to 3c show schematic side views of different embodiments with various positions of the electrode units or additional electrode units.

A further embodiment is shown in FIG. 3a. Therein, electrode unit 14 is located at distance $D_1$ below the emitter array system 10. Thereby, $D_1$ is smaller than $D_2$ (=D−$D_1$). Engaged with electrode unit 14 is a deflection system with electrostatic deflectors for scanning the electron beams over the specimen. Further details regarding the deflection of the electron beams will be described with respect to FIGS. 5a to 5c. Due to increased working distance D, it is possible to also increase the distance $D_2$ between the electrode unit and the specimen. Thus, a given deflection range can be realized with a smaller deflection angle.

Figure 3B:
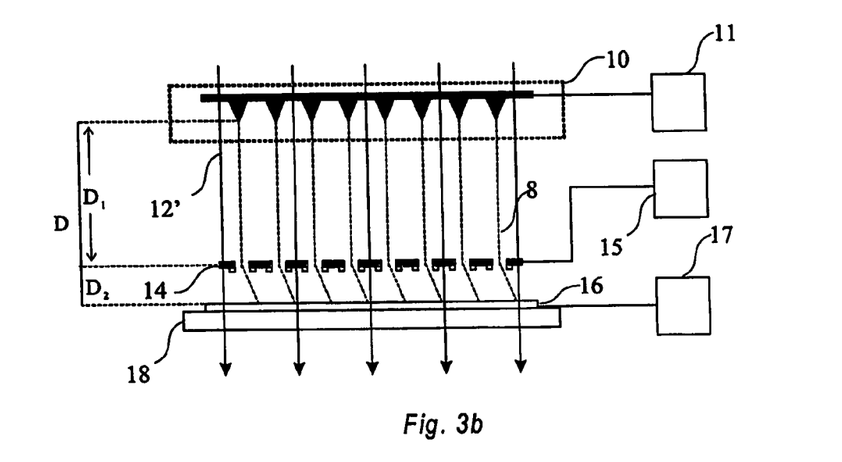
Figure 3C:
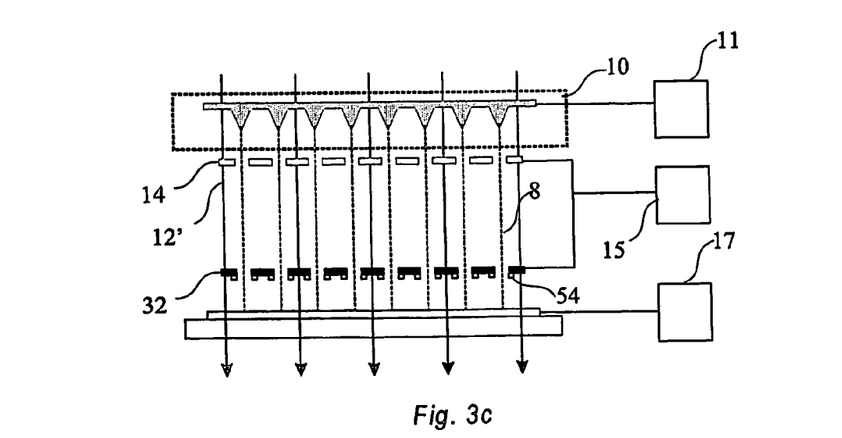

The differences between FIGS. 3a to 3c will be described in the following. It is possible to locate the electrode unit close to the emitter array system 10. Thereby, the region wherein the emitters are located is relatively small as compared to the region wherein the specimen is located (see FIG. 3a). According to another embodiment, it is possible to locate the electrode unit 14 closer to the specimen 16 (see FIG. 3b). In this case, the region wherein the emitter is located is larger than the region wherein the specimen is located. According to the embodiment of FIG. 3c it is also possible to provide a further electrode unit 32. Thereby, both electrode units can be biased to a high potential of e.g. 10 kV. Thus, the electrons are not continuously decelerated from electrode unit 14 to specimen 16, but are maintained at a high beam energy. Independent of a specific embodiment, it is generally possible to bias the upper electrode unit 14 to a different potential than the lower electrode unit 32.

As described above, increasing distance D2 is advantageous in view of the smaller deflection angles required for a scanning of the electron beams over the specimen. However, the position of the electrode unit 14 also influences the vacuum conditions. Assuming a constant leakage rate of a first chamber including the emitter, and a constant leakage rate of a second chamber including the specimen, the pressure differences calculate as follows:

$$\Delta p_i = C_i \cdot \frac{t}{V_i} \qquad \text{(No. 7)}$$

wherein i is an index for the first and the second chamber, C is the leakage rate, V is the volume and t is the time period between two pressure measurements.

Thus, without any pumping of a vacuum pump, the increase of the pressure due to leakage is proportional to 1/V. For a large volume of the chamber the increase of the pressure in the chamber is smaller.

In the case where there would be constructional difficulties to realize the UHV required for the emitter, it is preferred to increase the volume of the first chamber including the emitter array. In the case where the outgassing of the specimen would deteriorate the vacuum in the second chamber to an intolerable amount, it would be preferred to increase the volume of the second chamber including the specimen. Thus, a balance between these alternatives and the simplified scanning deflection for larger distances D2 has to be found.

The operational conditions of the differential pumping, which has been explained above, depends also on the pressure tightness of electrode unit 14. Depending on the number of apertures per area and the size of the apertures a transparency ratio of the electrode unit can be defined. If, for example, every 10 μm a round aperture with a radius of 1 μm is located, the transparency ratio is about 3:100. In the case of quadratic apertures with a length of 1 μm, the transparency ratio is 1:100. If, for example, every 100 μm a quadratic aperture with a side length of 1 μm is located, the transparency ratio is 1:10000.

Additionally or alternatively to the vacuum-isolation-usage of the electrode unit, a vacuum isolating aperture (not shown) can be used. Thereby, a further component, namely for example a multi-aperture, for improving the differential pumping is included in the devises according to the embodiments shown in this application.

According to a further embodiment (not shown) it is possible to use only one electrode unit 14 and position this unit such that $D_1$ is equal to $D_2$. In this case an intermediate focal point in the plane of the electrode unit 14 is obtained.

Figure 4A:
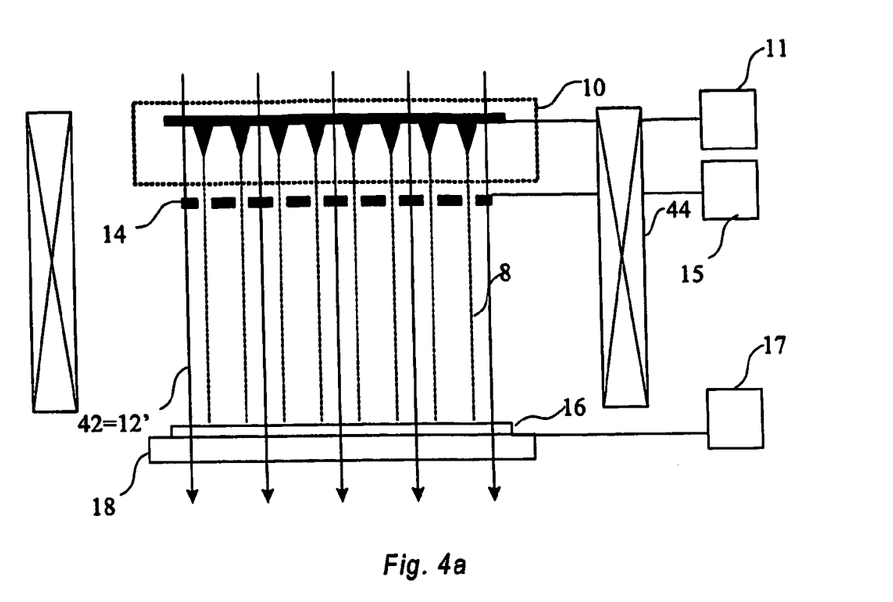
FIGS. 4a to 4d show schematic side views of different embodiments according to the present invention with various lens systems for generating a magnetic focusing field.

In the embodiments presented above, the focusing of the electron beams was indicated by a homogeneous magnetic lens field 12' (B). FIGS. 4a to 4d describe different embodiments to realize the homogenous focusing fields. FIG. 4a shows an embodiment wherein the electron beams travel with the elongated coil 44, a solenoid. A solenoid has a homogeneous magnetic field in its interior.

Figure 4B:
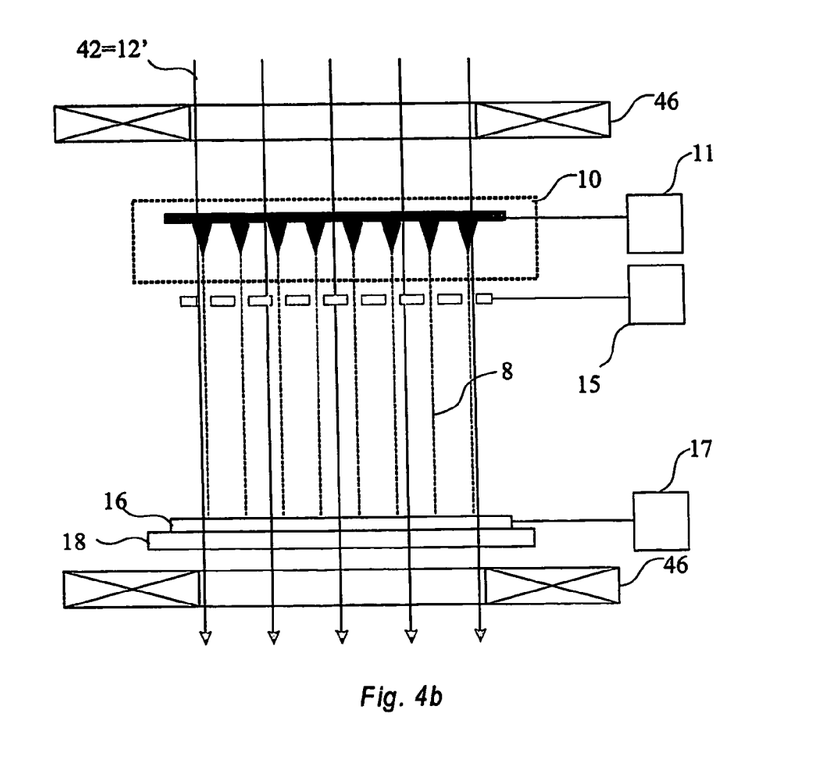

An alternative embodiment is shown in FIG. 4b. Thereby the system is located between two Helmholtz coils. Again, a homogenous magnetic field is generated.

Figure 4C:
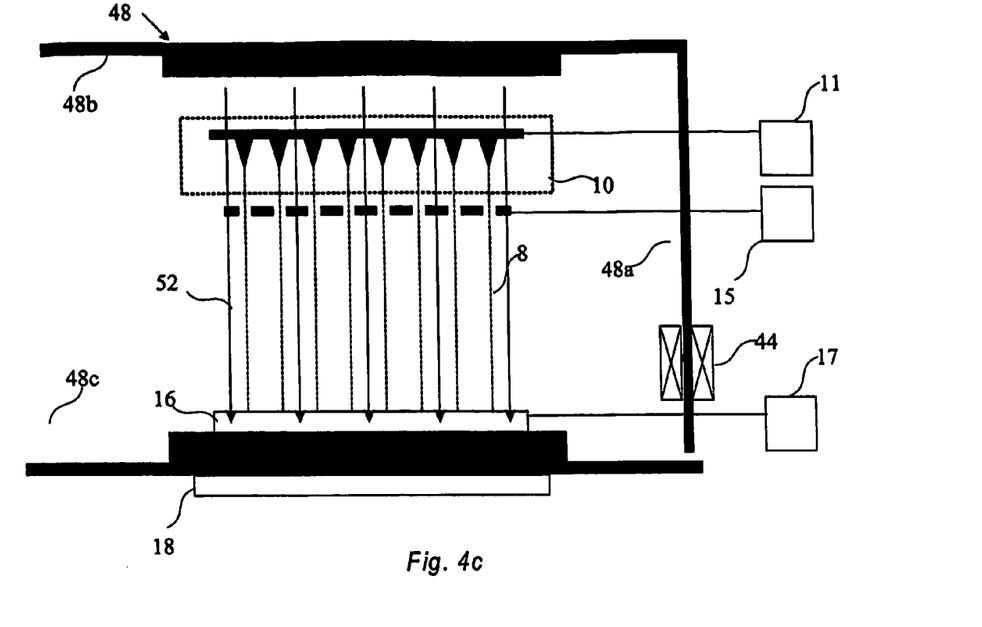

A further alternative embodiment shown in FIG. 4c used a system of pole pieces 48a to 48c, which is excited by coil 44. Depending on the shape of the pole pieces the magnetic field lines are homogeneous in the region of the electron beams. In FIG. 4c the pole pieces are arranged similar to a horseshoe magnet with magnetic fields in between pole pieces 48b and 48c. Since specimen 16 is located on the lower pole piece 48c, the lower pole piece is preferably moveable. Therefore, the specimen can be moved with respect to the electron beams. However, different solutions to provide a moveable specimen are possible. As an alternative, specimen 16 might be located on a specimen stage which would be located on the lower pole piece. In this example, specimen 16 would not be directly located on the lower pole piece.

According to an alternative embodiment (not shown), specimen stage 18 can be increased in size, can be made out of a magnetic conductive material and can, thus, act as the lower pole piece 48c.

Figure 4D:
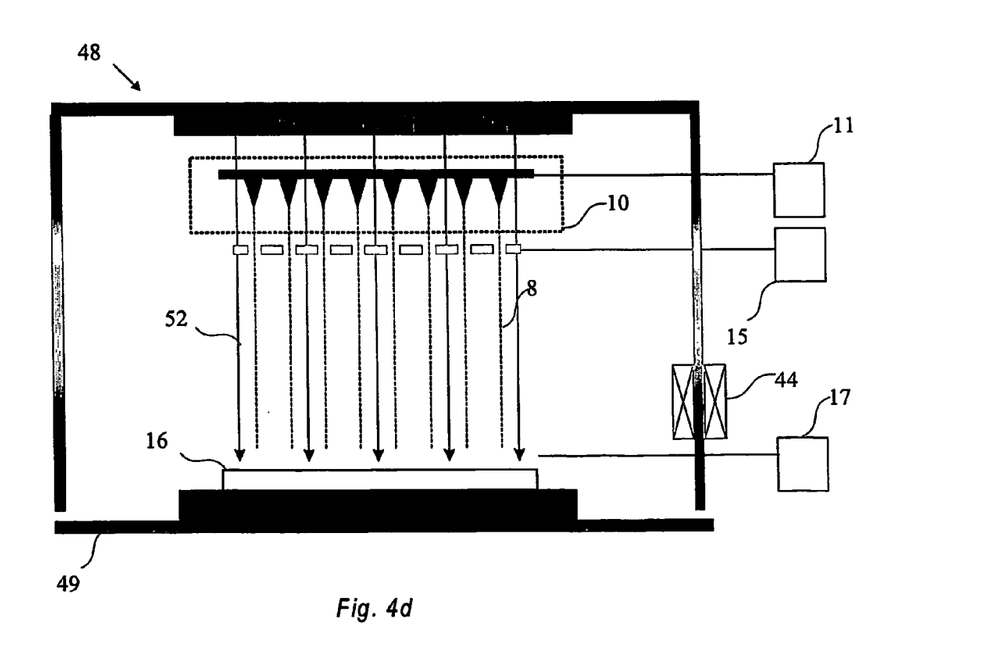

The embodiment shown in FIG. 4d uses an open pole piece for generation of the magnetic lens field. As already described with respect to FIG. 4c, not engaging plate 49 to pole piece 48 provides a movable specimen stage 18. Therefore, the stage design can more easily be conducted.

Plate 49 can either be magnetic or non-magnetic. On the one hand, a magnetic conductive material plate 49 closes the magnetic field lines. Therefore, the region below plate 49 is field free. However, a metal plate 49 will introduce an eddy current when moving the stage. Thus, an accurate stage movement is made more difficult.

On the other hand, a non-magnetic plate would introduce a non-uniform field, whereas the resulting field curvature introduces aberrations to the imaging of the electron beams. Independent of the material of plate 49, specimen stage 18 can be increased in size and could thus act as plate 49.

Figure 5A:
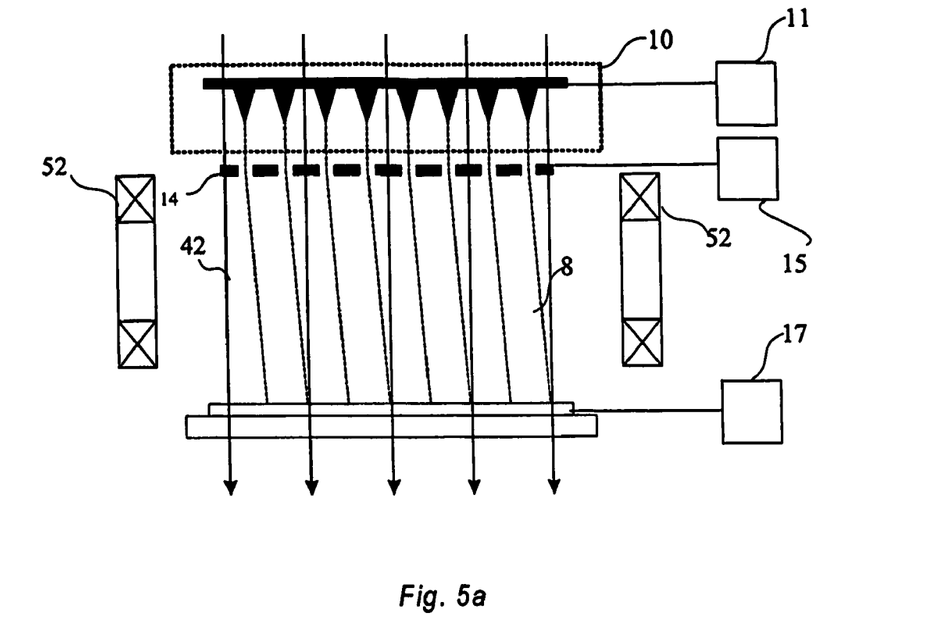
FIGS. 5a to 5b show schematic side views with embodiments according to the present invention with different deflection systems for deflecting the plurality of charged particle beams.
Figure 5B:
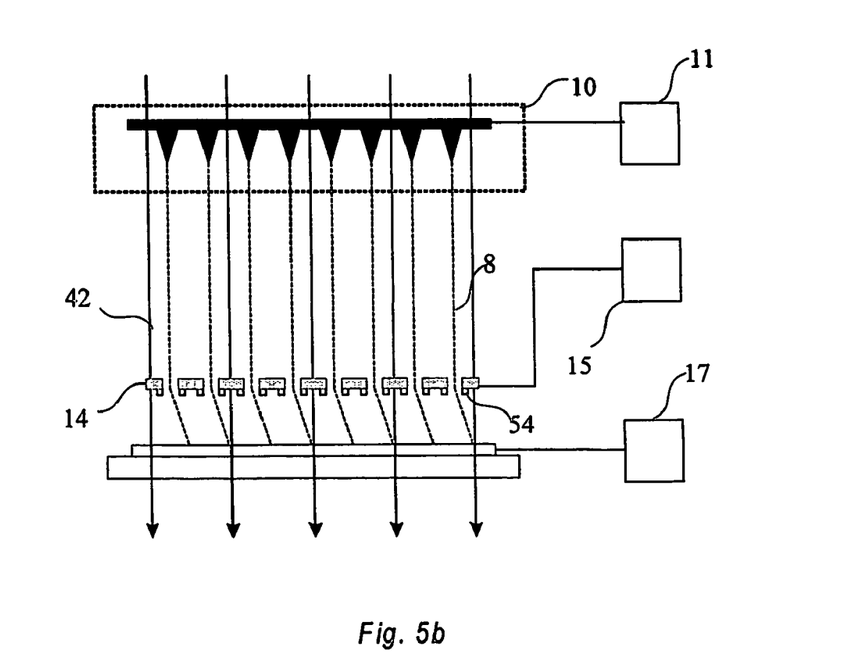
Figure 5C:
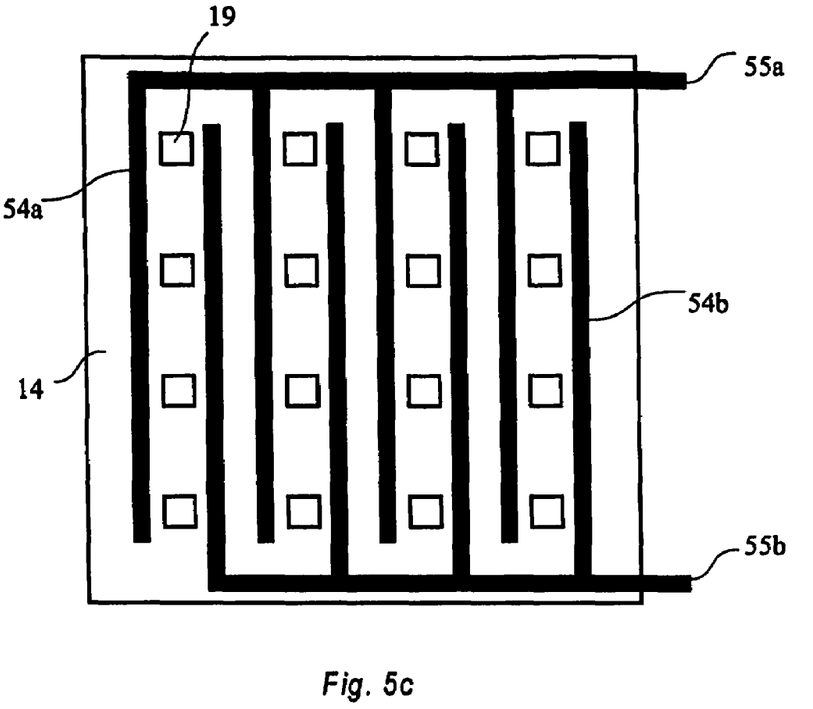
FIG. 5c shows a further embodiment of an electrode unit.

Further embodiments are shown in FIGS. 5a and 5c. Within FIG. 5a, electrode unit 14 is located close to emitter array system 10. Therefore, there is sufficient space to introduce a magnetic deflection system 52, which generates a magnetic field acting on all electron beams 8. Deflectors 52 deflect the plurality of electron beams over the specimen. Thus, different locations of the specimen can be inspected. Generally, scanning the specimen is conducted by a deflection of the electron beams in one dimension, whereas the specimen is moved with the specimen stage in another dimension. However, it is also possible to move the specimen in two dimensions or to deflect the electron beams in two dimensions.

Contrary to FIG. 5a, FIG. 5b shows an embodiment wherein the electrode unit 14 is located close to the specimen. Thus, magnetic deflectors 52 could not be positioned in such a way as to deflect electron beams 8 over the specimen. Therefore, electrostatic deflectors 54 are provided. The deflectors 54 are engaged with electrode unit 14. A respective embodiment is shown in FIG. 5c.

FIG. 5c shows deflectors 54a and 54b that are microfabricated on electrode unit 14 (see also FIG. 1b). The deflection signals are applied to connectors 55a and 55b. If different potentials are applied to connectors 55a and 55b, e.g. +100 V and −100V, an electrostatic field is generated between the respective electrodes. Thereby, the electron beams passing through apertures 19 are deflected.

Within the previous figures several embodiments have been explained. Thereby, aspects according to the present invention have mostly been independent of each other. For example the electron emitter system 10 comprising emitter array 22 can additionally comprise extraction means 24 and further additionally comprise emitting angle defining member 26. Different locations of the electrode unit 14 or the additional electrode unit 32 have been shown. As another example, different possibilities to bias the at least three potentials with respect to each other making use of at least two control units have been explained. Further, the generation of a homogeneous magnetic focusing field by a solenoid, by Helmholtz coils, or by different pole piece arrangements, have been described. Even further, different embodiments to deflect the plurality of electron beams have been discussed. Thereby, it was mentioned that the magnetic deflection (see 52 in FIG. 5a) can for constructional reasons not be used independently of the position of electrode unit 14. However, excluding this, all variations of emitting electrons, biasing different components, focusing the electron beams, accelerating the electron beams with one or more electrode units, and deflecting of the electron beams can be combined with each other. One example for such a combination is shown in FIG. 6.

Figure 6:
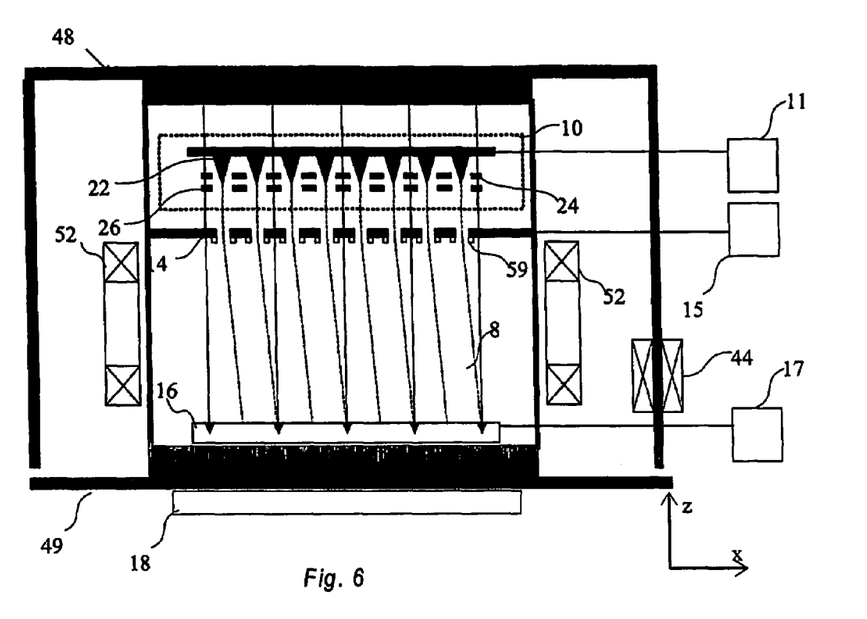
FIG. 6 shows a schematic side view of a further embodiment according to the present invention.

Within FIG. 6 the plurality of electron beams 8 are emitted by emitter array system 10. Emitter array system 10 comprises emitter array 22, extraction member 24, and emitting angle defining member. By decreasing $\alpha_0$ the resolution of the system is improved. Aperture unit 14 separates the region wherein the emitter array system 10 is located from the region wherein the specimen is located. By applying a potential of e.g. 50 kV to electrode unit 14 and a potential of e.g. 900 V to specimen 16 (both potentials relative to the emitter array), the electron beams are first accelerated to 50 keV and then decelerated to a lower energy of 900 V to impinge on the specimen. Due to the acceleration, the working distance between the emitter array 22 and the specimen 16 can be increased without deteriorating the resolution of the system immoderately.

Electron beams 8 are focused by a lens system, which comprises pole piece unit 48, coil 44, and metal plate 49. The excited pole pieces generate a homogeneous magnetic field that is substantially parallel to the path of the electron beams. Metal plate 49 closes the field lines at the bottom of the system, whereas the exterior of the system is field free.

The scanning of specimen 18 is conducted by deflecting the electron beams in x-direction with the magnetic deflection field generated by coils 52 and by moving the specimen in y-direction with specimen stage 18. Additionally, electrostatic deflectors 59 are provided. Contrary to the embodiment shown in FIG. 5c, electrostatic deflectors 59 are independently controllable for each electron beam. Thus, an adjustment of the position of the individual electron beams on the specimen with respect to each other can be realized.

Irrespective of specific embodiments described above, the charged particle devices used for the present invention are preferably mini-columns. A mini-column in this context is to be understood as a device with a distance between the emitter and the specimen of less than 100 mm.

The invention claimed is:

1. A charged particle beam device, comprising:
   an emitter array for emitting a plurality of charged particle beams;
   an extraction member for extracting the plurality of charged particle beams;
   a lens for imaging the plurality of charged particle beams;
   an electrode unit for accelerating the plurality of charged particle beams; and
   a first control unit and a second control unit for controlling potential differences between a first potential of the emitter array, a second potential of the electrode unit, and a third potential of a specimen, wherein the second potential is capable of accelerating the plurality of charged particle beams with respect to the first potential and the third potential is capable of decelerating the plurality of charged particle beams with respect to the second potential.

2. The charged particle beam device of claim 1, wherein the third potential is capable of defining a charged particle beam energy on impingement of the plurality of charged particle beams on the specimen such that it corresponds to a potential of maximal 5 kV; and
   the second potential is capable of increasing the charged particle beam energy to an energy that is at least a factor of 5 higher than the energy corresponding to the third potential.

3. The charged particle beam device of claim 1, further comprising;
   an emitting angle defining member for controlling the emitting angle of the plurality of charged particle beams.

4. The charged particle beam device of claim 1, wherein the emitter array is spaced from a specimen stage by at least 10 mm.

5. The charged particle beam device of claim 1, further comprising a further electrode unit biased to a potential which is capable of increasing the charged particle beam energy with respect to the energy corresponding to the third potential by at least a factor of 5.

6. The charged particle beam device of claim 5, wherein the electrode unit, the further electrode unit, or both are capable of providing a vacuum isolation.

7. The charged particle beam device of claim 6, wherein the vacuum isolation is provided by a transparency ratio between the area of apertures and the area of solid material of smaller than 1:100.

8. The charged particle beam device of claim 1, wherein the lens for imaging the plurality of charged particle beams comprises a unit for providing a homogenous magnetic field, wherein the unit for providing the homogenous magnetic field comprises at least one coil.

9. The charged particle beam device of claim 8, wherein the unit for providing a homogenous magnetic field further comprises at least a second coil.

10. The charged particle beam device of claim 8, wherein the unit for providing a homogenous magnetic field further comprises at least one pole piece.

11. The charged particle beam device of claim 10, wherein the unit for providing a homogenous magnetic field further comprises a lower pole piece which is movable with respect to the at least one pole piece.

12. The charged particle beam device of claim 1, further comprising a deflection system for deflecting the plurality of charged particle beams.

13. The charged particle beam device of claim 12, wherein the deflection system for deflecting the plurality of charged particle beams comprises a magnetic deflector for deflecting the plurality of charged particle beams.

14. The charged particle beam device of claim 12, wherein the deflection system for deflecting the plurality of charged particle beams comprises a plurality of electrostatic deflectors for individually deflecting the charged particle beams.

15. The charged particle beam device of claim 12, wherein the deflection system for deflecting the plurality of charged particle beams comprises an electrostatic deflector for deflecting the plurality of charged particle beams.

16. The charged particle beam device of claim 1, wherein the third potential is capable of defining the charged particle beam energy on impingement of the plurality of charged particle beams on the specimen such that it corresponds to a potential of maximal 1 kV.

17. The charged particle beam device of claim 1, wherein the second potential is capable of increasing the charged particle beam energy to an energy that is at least a factor of 10 higher than the energy corresponding to the third potential.

18. The charged particle beam device of claim 1, wherein the charged particle device is a minicolumn.

19. A method of imaging a plurality of charged particle beams, comprising:
   emitting the plurality of charged particle beams with an emitter array system;
   focusing the plurality of charged particle beams on a specimen with one lens;
   providing a first potential to the emitter array;
   providing a second potential to an extraction member so that the plurality of particle beams are extracted:
   providing a third potential to one electrode unit such that the plurality of charged particle beams are accelerated; and
   providing a fourth potential to a specimen such that the plurality of charged particle beams are decelerated before impingement on the specimen.

20. The method of claim 19, wherein the fourth potential is provided such that the plurality of charged particle beams impinge on the specimen with an energy corresponding to maximal 5 kV; and
   the third potential is provided such that the plurality of charged particle beams are accelerated to an energy at least 5 times higher than the energy on impingement on the specimen.

21. The method of claim 19, further comprising:
   providing a first vacuum in a first region between the emitter array and the electrode unit;
   providing a second vacuum in a second region between the electrode unit and the specimen; and
   wherein the pressure in the first vacuum is at least a factor of 10 lower than the pressure in the second vacuum.

22. The method of claim 19, further comprising:
   deflecting the plurality of charged particle beams.

* * * * *